(12) United States Patent
Inada

(10) Patent No.: US 10,038,515 B2
(45) Date of Patent: Jul. 31, 2018

(54) OPTICAL COMMUNICATION DEVICE, OPTICAL COMMUNICATION SYSTEM AND OPTICAL TRANSMISSION METHOD

(71) Applicant: NEC Corporation, Tokyo (JP)

(72) Inventor: Yoshihisa Inada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/127,586

(22) PCT Filed: Mar. 20, 2015

(86) PCT No.: PCT/JP2015/001578
§ 371 (c)(1),
(2) Date: Sep. 20, 2016

(87) PCT Pub. No.: WO2015/146105
PCT Pub. Date: Oct. 1, 2015

(65) Prior Publication Data
US 2017/0134112 A1   May 11, 2017

(30) Foreign Application Priority Data
Mar. 27, 2014   (JP) ................. 2014-065011

(51) Int. Cl.
*H04B 10/572* (2013.01)
*H04B 10/61* (2013.01)
(Continued)

(52) U.S. Cl.
CPC ........ *H04J 14/0227* (2013.01); *H01S 5/0687* (2013.01); *H04B 10/572* (2013.01); *H04B 10/61* (2013.01)

(58) Field of Classification Search
CPC .. H04J 141/0227; H04B 10/572; H04B 10/61
(Continued)

(56) References Cited

U.S. PATENT DOCUMENTS 5,387,992 A * 2/1995 Miyazaki ............. H04B 10/506
250/227.26
5,663,822 A 9/1997 Fee
(Continued)

FOREIGN PATENT DOCUMENTS

JP   H08-181660 A   7/1996
JP   2001-203643 A   7/2001
(Continued)

OTHER PUBLICATIONS

International Search Report, corresponding to PCT/JP2015/001578, dated Apr. 21, 2015, 2 pp.
(Continued)

*Primary Examiner* — Oommen Jacob
(74) *Attorney, Agent, or Firm* — Wilmer Cutler Pickering Hale and Dorr LLP

(57) ABSTRACT

[Problem] To provide an optical communication device and the like with which the optical signals output by multiple light output units can be set with an accurate wavelength interval.

[Solution] An optical communication device equipped with: multiple light output units that output optical signals of mutually different wavelengths; a multiplexing unit that outputs a wavelength-multiplexed signal by multiplexing the multiple optical signals output from the multiple light output units; a reference light output unit that outputs reference light serving as a reference; a wavelength generation unit that, on the basis of the reference light, outputs multiple light beams having a wavelength interval in accordance with a prescribed frequency; and a wavelength control unit that controls the wavelength of the optical signals output by the light output units in accordance with the (Continued)

interference component between the wavelength-multiplexed signal and light with the wavelength of at least one of the multiple light beams.

20 Claims, 12 Drawing Sheets

(51) Int. Cl.
  *H04J 14/02* (2006.01)
  *H01S 5/0687* (2006.01)
(58) Field of Classification Search
  USPC .............................................. 398/79, 98, 43
  See application file for complete search history.

(56) References Cited

U.S. PATENT DOCUMENTS

| | | | | |
|---|---|---|---|---|
| 5,861,975 | A * | 1/1999 | Sakuyama | H04B 10/572 398/196 |
| 5,898,719 | A * | 4/1999 | Ryu | H01S 5/0687 372/31 |
| 6,204,945 | B1 * | 3/2001 | Iwata | H04B 10/506 398/9 |
| 6,215,572 | B1 * | 4/2001 | Taneda | H04J 14/02 398/9 |
| 6,389,046 | B1 * | 5/2002 | Stayt, Jr. | H01S 5/06832 356/454 |
| 6,498,871 | B1 * | 12/2002 | Kuboki | H04B 10/506 385/24 |
| 6,678,480 | B1 * | 1/2004 | Aoki | G02B 6/4215 398/183 |
| 6,735,395 | B1 * | 5/2004 | Bai | H04B 10/504 372/31 |
| 8,285,147 | B2 * | 10/2012 | Beckett | H04B 10/505 398/182 |
| 2001/0045513 | A1 * | 11/2001 | Kourogi | G01N 21/4795 250/250 |
| 2002/0041414 | A1 * | 4/2002 | Oguma | H04B 10/07957 398/87 |
| 2003/0030876 | A1 * | 2/2003 | Takei | H04B 10/506 398/197 |
| 2003/0039015 | A1 * | 2/2003 | Vujkovic-Cvijin | H01S 3/1303 398/197 |
| 2003/0072336 | A1 * | 4/2003 | Senapati | H01S 5/0687 372/32 |
| 2005/0018724 | A1 * | 1/2005 | Da Silva | H04B 10/572 372/32 |
| 2005/0100065 | A1 * | 5/2005 | Coldren | H01S 5/0014 372/38.02 |
| 2006/0251424 | A1 * | 11/2006 | Nicholson | G02F 1/365 398/141 |
| 2011/0085794 | A1 * | 4/2011 | Lei | H04B 10/506 398/25 |
| 2013/0251368 | A1 | 9/2013 | Kim et al. | |
| 2014/0307753 | A1 * | 10/2014 | Minneman | H01S 5/06256 372/20 |
| 2017/0134112 | A1 * | 5/2017 | Inada | H04J 14/0227 |

FOREIGN PATENT DOCUMENTS

| | | |
|---|---|---|
| JP | 2010-154062 A | 7/2010 |
| JP | 2012-23607 A | 2/2012 |
| WO | WO-02/099939 A2 | 12/2002 |

OTHER PUBLICATIONS

Naoki Koda, et al., "Channel Selection by Optical Injection Locking in Frequency-Comb Based DWDM Transmission," 2012 17th Opto-Electronics and Communications Conference (OECC), Jun. 2, 2012, pp. 831-832, 2 pp.

Decision to Grant a Patent for Japanese Patent Application No. 2016-510009 dated Nov. 10, 2017 (4 pages).

Extended European Search Report issued by the European Patent Office for European Application No. 15769740.0 dated Feb. 15, 2018 (7 pages).

* cited by examiner

OPTICAL COMMUNICATION DEVICE, OPTICAL COMMUNICATION SYSTEM AND OPTICAL TRANSMISSION METHOD

CROSS-REFERENCE TO RELATED APPLICATIONS

The present application is a national stage application of International Application No. PCT/JP2015/001578 entitled "Optical Communication Device, Optical Communication System and Optical Transmission Method" filed on Mar. 20, 2015, which claims the benefit of priority from Japanese Patent Application No. JP2014-065011, filed on Mar. 27, 2014, the disclosures of which are incorporated herein in their entirety by reference thereto.

TECHNICAL FIELD

The present invention relates to an optical communication device, an optical communication system and an optical transmission method.

BACKGROUND ART

There is a method of narrowing the wavelength (frequency) interval of a wavelength multiplexing optical signal to improve frequency utilization efficiency for the purpose of increasing the transmission capacity of an optical fiber transmission system. However, this method has a problem that an influence of overlapping (cross talk) of optical spectra between adjacent channels is increased since the number of wavelengths of a wavelength-multiplexed optical signal is large, thereby deteriorating the transmission quality of the wavelength multiplexing optical signal.

For the above-mentioned problem, PTL 1 discloses a technique of making the wavelength of an optical signal to be output from each of a plurality of optical transmitters coincide with the wavelength of a reference wavelength optical signal, by using a transmission wavelength variable filter. The reference wavelength optical signal is one of a plurality of optical signals whose wavelength intervals are constant, which are obtained by frequency-modulating a predetermined light source with an output from a microwave oscillator. The technique described in PTL 1 makes wavelength intervals of a plurality of optical signals to be output from a plurality of optical transmitters coincide with a wavelength interval generated by the microwave oscillator.

In a technique described in PTL 1, each of a plurality of optical transmitters comprises the transmission wavelength variable filter, and each of the optical transmitters controls the transmission wavelength variable filter so that the intensity of a reference wavelength optical signal becomes a maximum. The optical transmitter then controls the wavelength of an optical signal to be output so that the wavelength of the optical signal to be output becomes a maximum at the transmission wavelength variable filter. As mentioned above, the technique described in PTL 1 indirectly makes the wavelength of an optical signal to be output from each of a plurality of optical transmitters coincide with a reference wavelength optical signal by using a transmission wavelength variable filter. PTL 2 describes a frequency control method of an optical transmitter or an optical receiver used in a wavelength multiplexing optical communication network.

CITATION LIST

Patent Literature

[PTL 1] Japanese Unexamined Patent Application Publication No. 2001-203643
[PTL 2] Japanese Unexamined Patent Application Publication No. H08-181660

SUMMARY OF INVENTION

Technical Problem

As described above, a technique described in PTL 1 indirectly makes the wavelength contained in a reference wavelength optical signal coincide with the wavelength of an optical signal to be output from each of a plurality of optical transmitters by using a transmission wavelength variable filter.

However, in the technique described in PTL 1, the wavelength of an optical signal to be adjusted depends on the accuracy of a transmission wavelength variable filter. The characteristics of a transmission wavelength variable filter change with temperature or time. This involves a shift in a wavelength of an optical signal to be adjusted and an overlap of optical spectra between adjacent channels deteriorates the transmission quality of a wavelength multiplexing optical signal, which is problematic. In addition, PTL 2 does not disclose a technique for solving such a problem.

An object of the present invention is to solve the above-described problems and to provide an optical communication device or the like which can output a wavelength-multiplexed optical signal whose wavelength interval has higher accuracy.

Solution to Problem

The optical communication device of the present invention includes: a plurality of light output unit that outputs optical signals having different wavelengths, a multiplexing unit that outputs a wavelength-multiplexed signal obtained by multiplexing a plurality of optical signals output from the plurality of light output units, a reference light output unit that outputs a reference light that is a reference, a wavelength generation unit that outputs, based on the reference light, a plurality of lights having a wavelength interval depending on a predetermined frequency, and a wavelength control unit that controls, depending on an interference component between the wavelength-multiplexed signal and a light having at least one wavelength among the plurality of lights, a wavelength of an optical signal output from the light output unit.

The optical communication system of the present invention includes: an optical communication device including a plurality of light output unit that outputs optical signals having different wavelengths, a multiplexing unit that outputs a wavelength-multiplexed signal obtained by multiplexing a plurality of optical signals output from the plurality of light output unit, a reference light output unit that outputs a reference light that is a reference, a wavelength generation unit that outputs, based on the reference light, a plurality of lights having a wavelength interval depending on a predetermined frequency, and a wavelength control unit that controls, depending on an interference component between the wavelength-multiplexed signal and a light having at least one wavelength among the plurality of lights, a wavelength of an optical signal output from the light output unit; and a control device that instructs the optical communication device to control a wavelength of an optical signal output from at least one of the plurality of light output unit at a predetermined timing.

The optical communication method of the present invention includes: outputting a plurality of optical signals having different wavelengths from light output unit; outputting the wavelength-multiplexed signal obtained by multiplexing a plurality of optical signals; outputting a reference light that is a reference; outputting, based on the reference light, a plurality of lights having a wavelength interval depending on a predetermined frequency; and controlling, depending on an interference component between the wavelength-multiplexed signal and a light having at least one wavelength among the plurality of lights, a wavelength of an optical signal output from the light output unit.

The program recording medium for a program stores thereon a program for allowing a computer to execute: a processing of outputting optical signals having different wavelengths; a processing of outputting a wavelength-multiplexed signal obtained by multiplexing a plurality of optical signals output from the plurality of light output units; a processing of outputting a reference light that is a reference; a processing of outputting, based on the reference light, a plurality of lights having a wavelength interval depending on a predetermined frequency, and a processing of controlling, depending on an interference component between the wavelength-multiplexed signal and a light having at least one wavelength among the plurality of lights, a wavelength of an optical signal output from the light output unit.

Advantageous Effects of Invention

The optical communication device or the like of the present invention can advantageously output a wavelength-multiplexed optical signal whose wavelength interval has a higher accuracy.

DESCRIPTION OF EMBODIMENTS

First Exemplary Embodiment

A first exemplary embodiment of the present invention will be described with reference to the Drawings.

Figure 1:
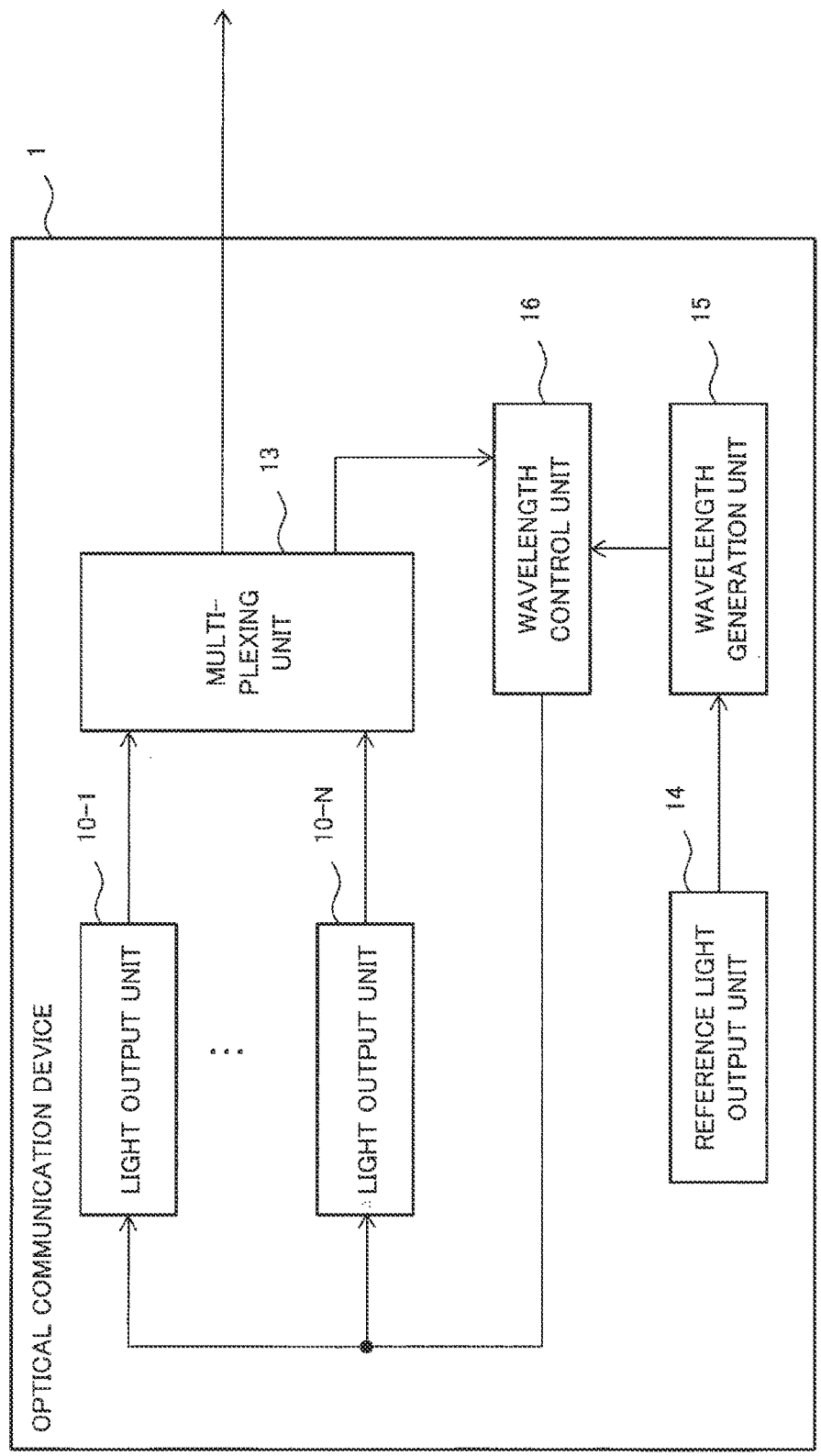
FIG. 1 is a diagram illustrating a configuration example of an optical communication device in a first exemplary embodiment of the present invention.

FIG. 1 is a diagram illustrating a configuration example of an optical communication device 1 in a first exemplary embodiment of the present invention. As illustrated in FIG. 1, the optical communication device 1 comprises a plurality of light output units 10-1 to 10-N (unless there is a particular need for distinction, referred to as "light output unit 10"), a multiplexing unit 13, a reference light output unit 14, a wavelength generation unit 15, and a wavelength control unit 16.

The plurality of light output units 10 output optical signals having different wavelengths.

The multiplexing unit 13 outputs a wavelength-multiplexed signal obtained by multiplexing a plurality of optical signals output from the plurality of light output units 10 to the outside of the optical communication device 1. The multiplexing unit 13, for example, can branch part of a wavelength-multiplexed signal by an optical coupler or the like, and output the part of a wavelength-multiplexed signal to the wavelength control unit 16.

The reference light output unit 14 outputs a reference light which is a reference for the wavelength of an optical signal to be output from each light output unit 10. The light output unit 10 and the reference light output unit 14 are, for example, a laser or the like which can output a coherent light. The type of the structure or the like of the laser is not restricted, and may be, for example, a variable wavelength laser or the like in which an output wavelength can be changed.

The wavelength generation unit 15 outputs a plurality of lights having a wavelength interval corresponding to the frequency, for example, based on an electric signal having a frequency depending on a wavelength interval of each optical signal of a wavelength-multiplexed optical signal transmitted by a light transmission path. The wavelength generation unit 15 may output a plurality of lights, for example, by an optical comb generator which includes a combination of a phase modulator and a resonator.

The wavelength control unit 16 compares a wavelength of a light from the wavelength generation unit 15 and a wavelength of a wavelength-multiplexed optical signal from the multiplexing unit 13. The wavelength control unit 16 compares a light from the wavelength generation unit 15 and a wavelength-multiplexed optical signal from the multiplexing unit 13 by directly interfering two input lights like, for example, an optical interferometer. Here, the lights to be interfered may be, for example, part of an optical signal in a wavelength-multiplexed optical signal or part of a plurality of lights from the wavelength generation unit 15. A light of part of wavelengths can be taken out from a light of a plurality of wavelengths by an optical filter or the like.

The wavelength control unit 16 controls a wavelength of an optical signal to be output from the light output unit 10 corresponding to the compared wavelength based on the compared result. For example, the wavelength control unit 16 controls a wavelength of an optical signal output from the light output unit 10 to eliminate a wavelength shift between a light from the wavelength generation unit 15 and a wavelength-multiplexed optical signal from the multiplexing unit 13. For example, the wavelength control unit 16 controls a wavelength of an optical signal output from the light output unit 10 to maximize the interference between two lights when a spectrointerferometer is used. The wavelength of an optical signal output from the light output unit 10 may be changed, for example, by the temperature or driving current of a laser or may be changed by controlling an oscillation wavelength in the case of a variable wavelength laser.

Figure 2:
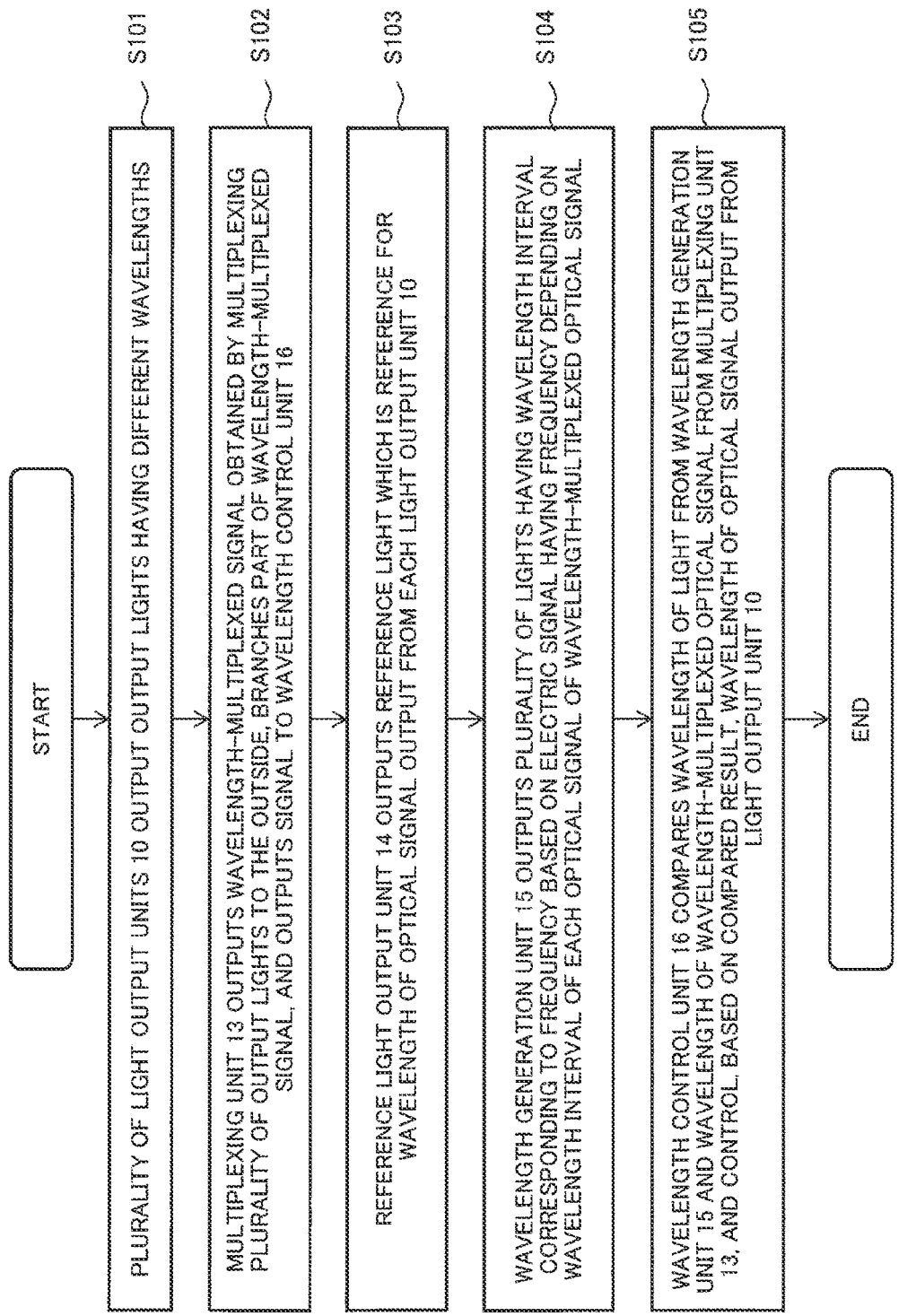
FIG. 2 is a flow chart illustrating an operational example of an optical communication device in the first exemplary embodiment of the present invention.

FIG. 2 is a flow chart illustrating an operational example of an optical communication device 1 in the first exemplary embodiment of the present invention.

A plurality of light output units 10 output optical signals having different wavelengths (S101).

The multiplexing unit 13 outputs a wavelength-multiplexed signal obtained by multiplexing a plurality of optical signals output from a plurality of light output units 10 to the outside of the optical communication device 1, the multiplexing unit 13 branches part of the wavelength-multiplexed signal, and outputs part of the wavelength-multiplexed signal to the wavelength control unit 16 (S102).

The reference light output unit 14 outputs a reference light which is a reference for a wavelength of an optical signal output from each light output unit 10 (S103).

The wavelength generation unit 15 outputs a plurality of lights having a wavelength interval corresponding to the frequency, for example, based on an electric signal having a frequency depending on a wavelength interval of each optical signal of a wavelength-multiplexed optical signal transmitted by a light transmission path (S104).

The wavelength control unit 16 compares a wavelength of a light from the wavelength generation unit 15 and a wavelength of a wavelength-multiplexed optical signal from the multiplexing unit 13, and controls a wavelength of an optical signal output from the light output unit 10 based on the compared result (S105).

As mentioned above, the wavelength control unit 16 of the optical communication device 1 of the first exemplary embodiment of the present invention directly compares a wavelength of a light from the wavelength generation unit 15 and a wavelength of a wavelength-multiplexed optical signal from the multiplexing unit 13, and controls a wavelength of an optical signal output from the light output unit 10 corresponding to the compared wavelength. Accordingly, the optical communication device 1 in the first exemplary embodiment of the present invention can output a wavelength-multiplexed optical signal whose wavelength interval has higher accuracy.

Second Exemplary Embodiment

A second exemplary embodiment of the present invention will be described with reference to the Drawings. Description of a configuration in the second exemplary embodiment of the present invention similar to that of the first exemplary embodiment of the present invention will be omitted.

Figure 3:
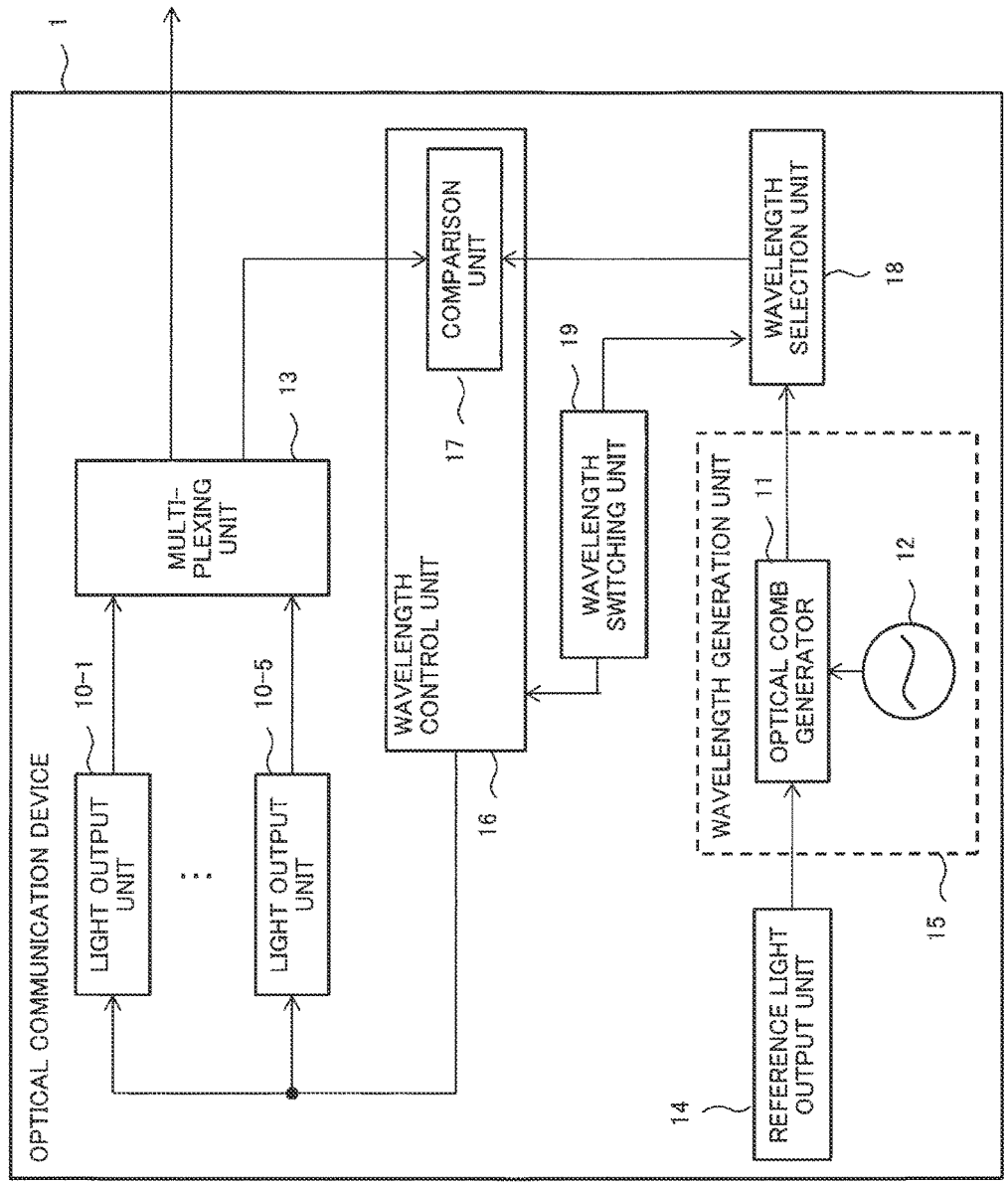
FIG. 3 is a diagram illustrating a configuration example of an optical communication device 1 in a second exemplary embodiment of the present invention.

FIG. 3 is a diagram illustrating a configuration example of the optical communication device 1 in the second exemplary embodiment of the present invention. As illustrated in FIG. 3, the optical communication device 1 in the second exemplary embodiment of the present invention comprises light output units 10-1 to 10-5, a multiplexing unit 13, a reference light output unit 14, a wavelength generation unit 15, a wavelength control unit 16, a wavelength selection unit 18, and a wavelength switching unit 19. The number of the light output units 10 is not restricted to five, and any number of the light output units 10 may be used. The wavelength generation unit 15 includes an optical comb generator 11 and a microwave oscillator 12. The wavelength control unit 16 comprises a comparison unit 17.

A plurality of light output units 10 output optical signals having different wavelengths. The wavelength of an optical signal output from each of the plurality of light output units 10 is set to have a predetermined interval. The wavelength of an optical signal output from each of the plurality of light output units 10, however, may shift from a set wavelength due to device-specific optical frequency setting accuracy.

Figure 4:
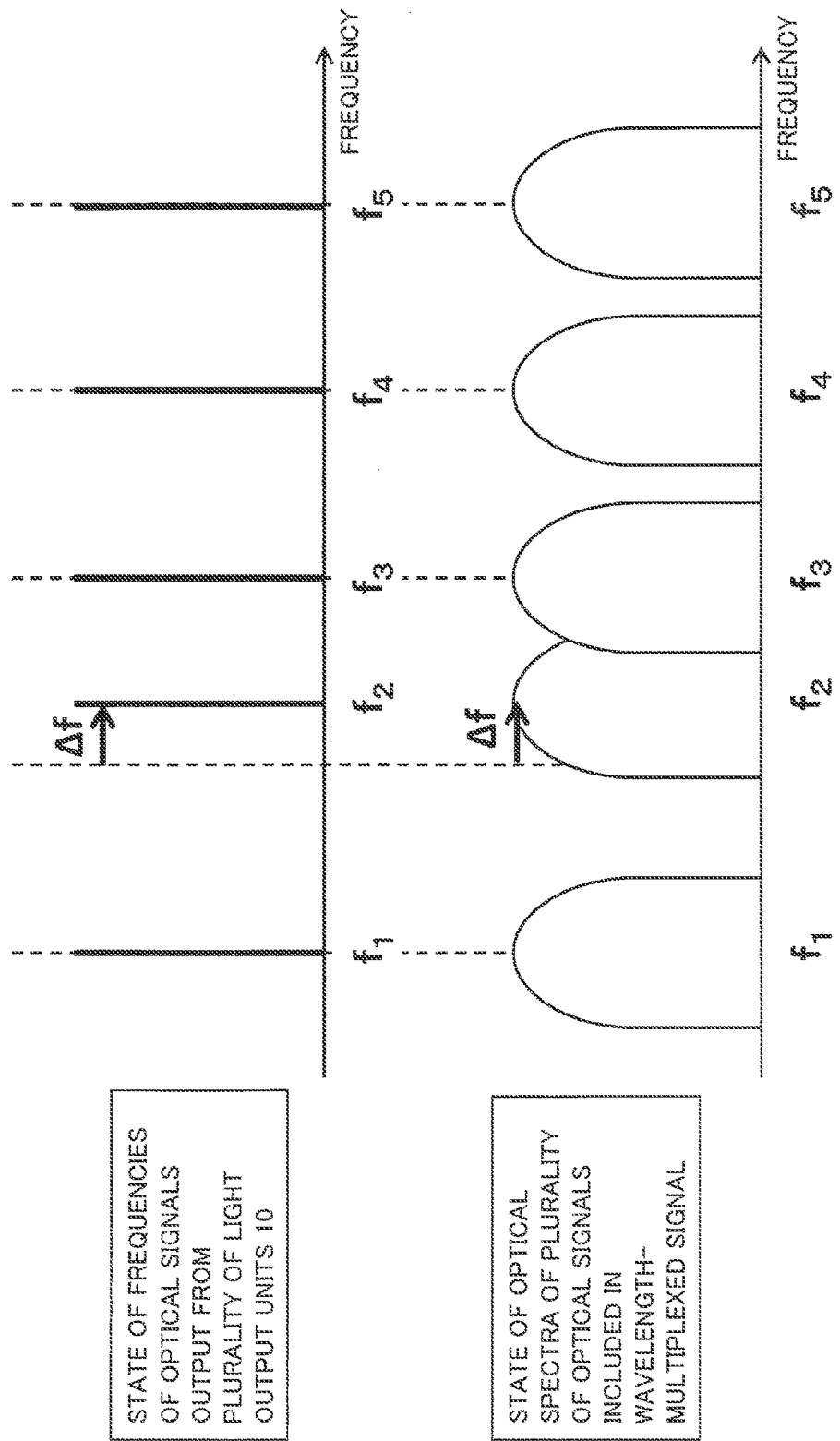
FIG. 4 is a diagram illustrating an example of a state of frequencies of optical signals output from a plurality of light output units 10 and a state of frequencies of a plurality of optical signals included in a wavelength-multiplexed signal output from the multiplexing unit 13 in the second exemplary embodiment of the present invention.

FIG. 4 is a diagram illustrating an example of a state of frequencies corresponding to wavelengths of optical signals output from a plurality of light output units 10 and a state of optical spectrum of a plurality of optical signals included in a wavelength-multiplexed signal output from the multiplexing unit 13. FIG. 4 illustrates an example in which the frequency of an optical signal output from the light output unit 10-2 shifts by "+$\Delta f$". The frequency of an optical signal output from the light output unit 10 shifts from a desired frequency by "+$\Delta f$" due to, for example, a change with time.

In FIG. 4, a frequency $f_1$ of an optical signal output from the light output unit 10-1 is represented by "$f_1 = f_0 - 2 \times f_m$", and a frequency $f_2$ of an optical signal output from the light output unit 10-2 is represented by "$f_2 = f_0 - f_m + \Delta f$". Here, the $f_0$ is the frequency of a reference light output from the reference light output unit 14. The $f_m$ is a frequency interval of adjacent optical signals (i.e., between adjacent channels) output from the light output unit 10. Similarly, a frequency $f_3$ of an optical signal output from the light output unit 10-3 is represented by "$f_3 = f_0$", a frequency $f_4$ of an optical signal output from light output unit 10-4 is represented by "$f_4 = f_0 + f_m$", and a frequency $f_5$ of an optical signal output from light output unit 10-5 is represented by "$f_5 = f_0 + 2 \times f_m$".

As illustrated in FIG. 4, when the frequency of an optical signal output from the light output unit 10-2 shifts by "+$\Delta f$", optical spectra overlap between adjacent channels (an optical signal output from the light output unit 10-2 and an optical signal output from the light output unit 10-3) in a wavelength-multiplexed signal.

Accordingly, the optical communication device 1 of the second exemplary embodiment of the present invention controls the wavelength of an optical signal output from at least one of a plurality of light output units 10 to make the wavelength of an optical signal output from the plurality of light output units 10 coincide with the wavelength of at least one of lights to be generated by the optical comb generator 11.

In the second exemplary embodiment of the present invention, the plurality of light output units 10 are controlled in such a way that optical spectra are not shifted between adjacent channels to a degree to which the optical spectra overlap. The temperatures or the like of the plurality of light output units 10 are controlled. For this reason, it is sufficient to consider a shift of a wavelength (a frequency corresponding to the wavelength) by which optical spectra between the adjacent channels overlap.

The multiplexing unit 13 outputs a wavelength-multiplexed signal obtained by multiplexing optical signals output from a plurality of light output units 10 to the outside of the optical communication device 1. The multiplexing unit 13, for example, can branch part of a wavelength-multiplexed signal by an optical coupler or the like, and output the part of a wavelength-multiplexed signal to the comparison unit 17.

The reference light output unit 14 outputs a reference light having a wavelength corresponding to a frequency $f_0$ which is a reference for the wavelength of an optical signal to be output from each light output unit 10. The reference light output from the reference light output unit 14 is input to the optical comb generator 11.

A microwave oscillator 12 in the wavelength generation unit 15 outputs a clock signal (an electric signal) having a frequency $F_m$. The frequency $F_m$ is, for example, 50 GHz or 40 GHz. The frequency $F_m$ of a clock signal corresponds to a wavelength interval of a plurality of optical signals output from the plurality of light output units 10. A clock signal output from the microwave oscillator 12 is input to the optical comb generator 11. For the microwave oscillator 12, for example, an oscillator for modulation described in Japanese Patent No. 3444958 can be used.

The optical comb generator 11 is driven by a clock signal input from the microwave oscillator 12, and generates a plurality of sideband lights (optical comb) having wavelengths corresponding to frequencies around the frequency $f_0$ at a frequency interval of $F_m$ when a reference light having a wavelength corresponding to the frequency $f_0$ is input.

Here, for the optical comb generator 11, an optical comb generator described in Japanese Patent No. 3444958 can be used. The optical comb generator described in Japanese Patent No. 3444958 outputs an optical comb composed of several hundreds of optical spectral lines arranged around an optical frequency of a laser beam emitted from a wavelength stabilized light source at an optical frequency interval of fm.

Figure 5:
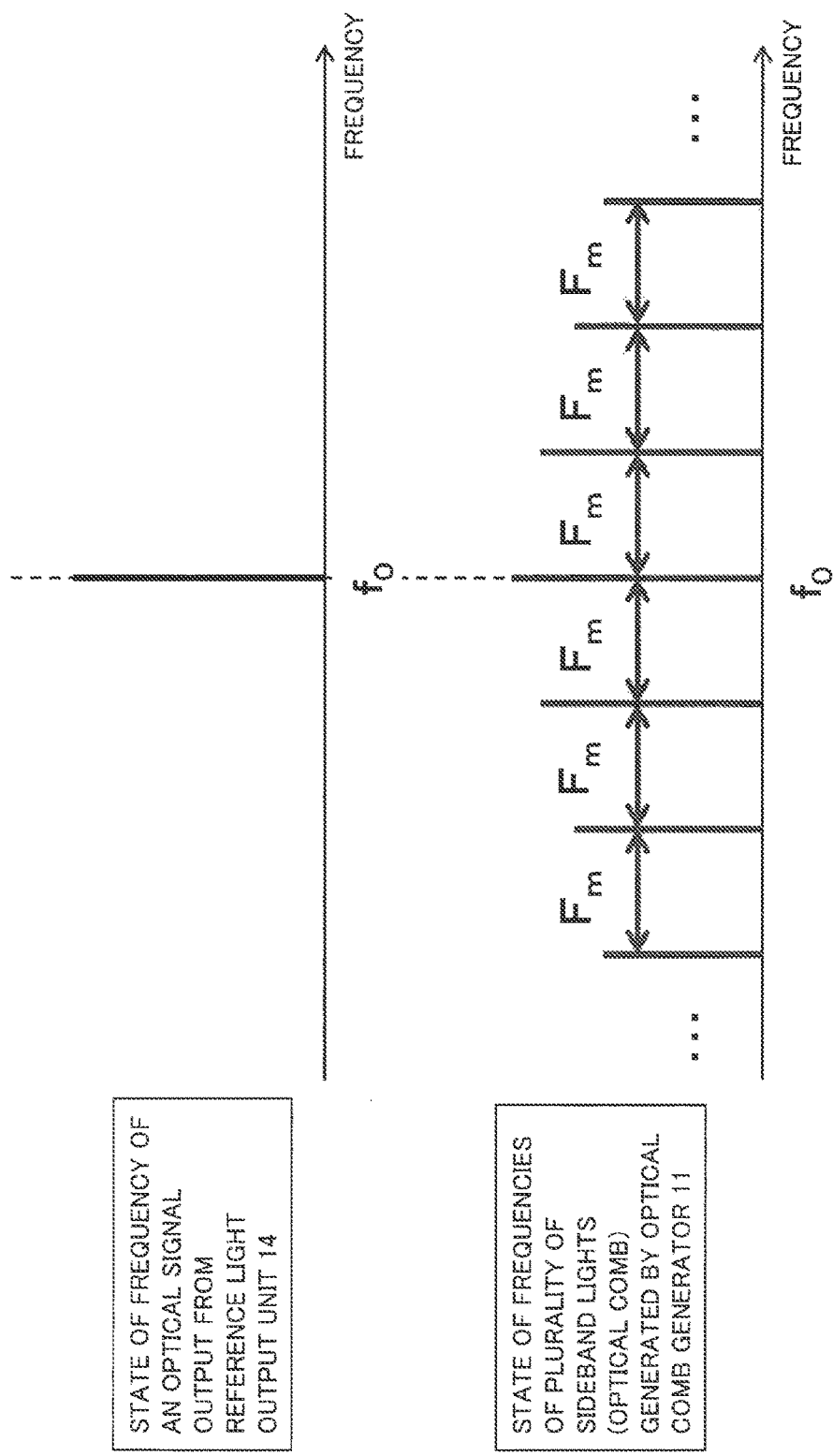
FIG. 5 is a diagram illustrating a state of a frequency of a reference light output from a reference light output unit 14 and a state of frequencies of a plurality of sideband lights (optical comb) generated by an optical comb generator 11 in the second exemplary embodiment of the present invention.

FIG. 5 is a diagram illustrating a state of a frequency of a reference light output from the reference light output unit 14, and a state of frequencies of an optical comb generated by the optical comb generator 11. As illustrated in FIG. 5, a plurality of lights output from the optical comb generator 11 are an optical comb having a frequency interval of $F_m$ around a frequency $f_0$ of a reference light. The frequency interval of the optical comb generated by the optical comb generator 11 is highly accurately controlled, and highly accurately corresponds to a frequency $F_m$ of a clock signal input from the microwave oscillator 12.

The wavelength selection unit 18 inputs, among a plurality of lights included in an optical comb generated by the optical comb generator 11, a light whose wavelength has been specified by the wavelength switching unit 19 to the comparison unit 17. For the wavelength selection unit 18, for example, a wavelength selection switch described in Japanese Patent No. 4748514 can be used. The wavelength selection switch can output a light having a desired wavelength among a plurality of input lights. The wavelength selection switch comprises an optical waveguide circuit formed on a substrate and control means for adding thermal variations to the optical waveguide circuit and performing switching control of an optical signal path, and can precisely control the wavelength of a light to be output.

The comparison unit 17 compares a wavelength of a light from the wavelength generation unit 15 and a wavelength of a wavelength-multiplexed optical signal from the multiplexing unit 13. Specifically, the comparison unit 17 compares a frequency "$f_2=f_0-f_m+\Delta f$" corresponding to a wavelength of an optical signal output from the light output unit 10-2 included in the wavelength-multiplexed signal and a frequency "$f_0-2 \times F_m$" corresponding to a wavelength of a light input from the wavelength selection unit 18. For the comparison unit 17, an optical signal detection device described in Japanese Patent No. 2758556 can be used. The optical signal detection device described in Japanese Patent No. 2758556 measures an interference intensity (interference component) which is a difference between input two optical signals. As a result of comparison, the comparison unit 17 detects a difference of wavelengths corresponding to a difference ("$\Delta f$") between both of the optical signals.

The wavelength control unit 16 controls the wavelength of an optical signal output from the light output unit 10 in such a way that the difference (shift) detected by the comparison unit 17 is compensated. Here, for the light output unit 10, for example, a wavelength variable laser device described in Japanese Patent No. 3197869 can be used. In the wavelength variable laser described in Japanese Patent No. 3197869, a diffraction grating is used for a wavelength selecting element, and a wavelength to be output (to be selected) can be changed by adjusting the angle of the diffraction grating.

The wavelength switching unit 19 specifies a wavelength to be selected by the wavelength selection unit 18, and requests the wavelength selection unit 18 to output a light having the specified wavelength. The wavelength switching unit 19 specifies a light output unit 10 which outputs an optical signal having the specified wavelength, and notifies the specified light output unit 10 (for example, a light output unit 10-2) to the wavelength control unit 16.

Figure 6:
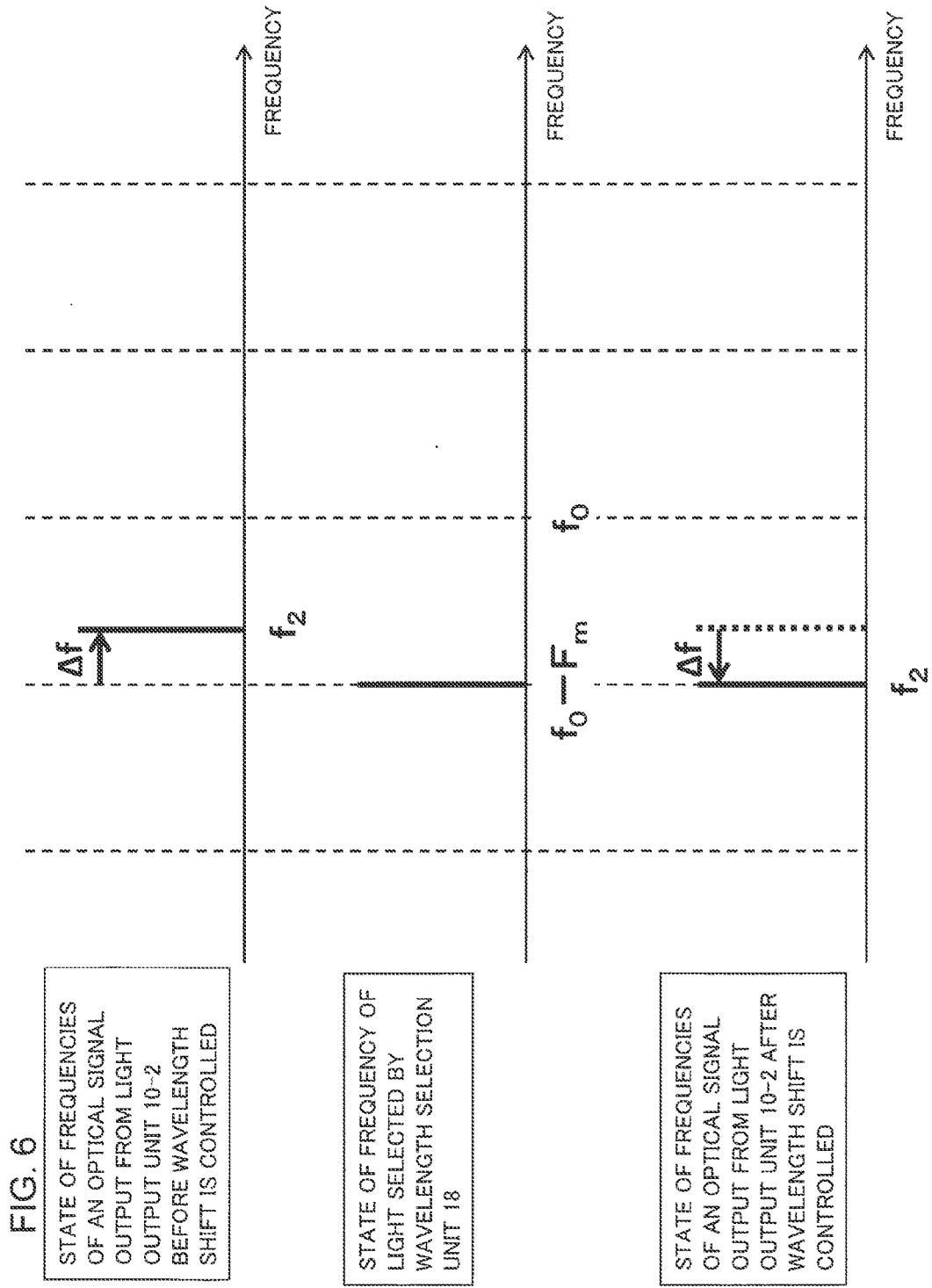
FIG. 6 is a diagram illustrating an example of a state of a frequency of an optical signal selected by a wavelength selection unit 18 from a plurality of optical signals generated by the optical comb generator 11 and states of a frequency of a light output unit 10-2 before and after adjustment of the frequency by a wavelength control unit 16.

FIG. 6 is a diagram illustrating a state of a frequency corresponding to the wavelength of a light selected by the wavelength selection unit 18 (specified by the wavelength switching unit 19) among a plurality of lights generated by the optical comb generator 11. FIG. 6 is a diagram illustrating states of a frequency corresponding to a wavelength of an optical signal output from the light output unit 10-2 before and after controlling a shift of a wavelength by the wavelength control unit 16.

FIG. 6 is an example in which an optical signal output from the light output unit 10-2 shifts by a wavelength corresponding to a frequency $\Delta f$, and the wavelength control unit 16 compensates a wavelength component corresponding to the frequency $\Delta f$.

As illustrated in FIG. 6, the wavelength control unit 16 compensates a shift "$\Delta f$" (a shift of wavelength correspond thereto) of a frequency of an optical signal output from the light output unit 10-2. The wavelength control unit 16 compensates a shift between both of the wavelengths by controlling to make a frequency of an optical signal output from the light output unit 10-2 coincide with a frequency "$f_0-F_m$" of a light selected by the wavelength selection unit 18.

The wavelength switching unit 19 may control a wavelength of an optical signal to be output for all the light output units 10 while switching light output units 10-1 to 10-5 to be controlled and lights to be selected by the wavelength selection unit 18 in turn. By this, the optical communication device 1 can make a wavelength interval of an optical signal output from each of the light output units 10-1 to 10-5 correspond to a frequency interval "$F_m$" of a plurality of sideband lights (optical comb) generated by the optical comb generator 11.

Figure 7:
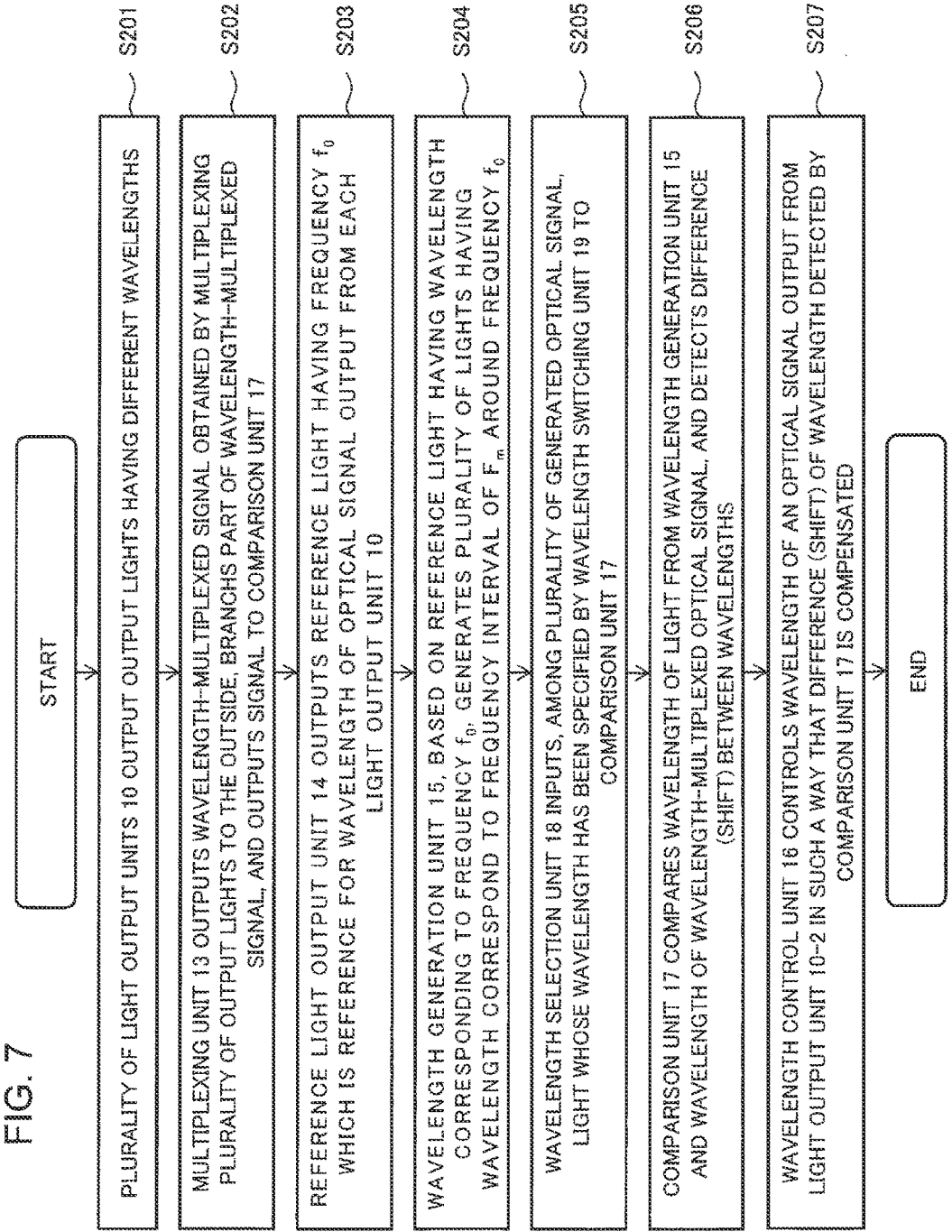
FIG. 7 is a flow chart illustrating an operational example of the optical communication device 1 in the second exemplary embodiment of the present invention.

FIG. 7 is a flow chart illustrating an operational example of the optical communication device 1 in the second exemplary embodiment of the present invention. FIG. 7 is an example in which a wavelength of an optical signal output from the light output unit 10-2 shifts by a wavelength corresponding to a frequency "+Δf", and the wavelength of an optical signal output from the light output unit 10-2 is compensated.

A plurality of light output units 10 output optical signals having different wavelengths (S201).

A wavelength-multiplexed signal obtained by multiplexing a plurality of optical signals output from a plurality of light output units 10 is output to the outside of the optical communication device 1, part of the wavelength-multiplexed signal is branched, and the part of the wavelength-multiplexed signal is output to the comparison unit 17 (S202).

The reference light output unit 14 outputs a reference light having a frequency $f_0$ which is a reference of a wavelength of an optical signal output from each light output unit 10 (S203).

The wavelength generation unit 15 generates, based on a reference light having a wavelength corresponding to a frequency $f_0$ output from the reference light output unit 14, a plurality of lights having wavelengths around the frequency $f_0$ at a frequency interval of $F_m$ (S204).

The wavelength selection unit 18 inputs, among the plurality of generated optical signals, a light whose wavelength has been specified by the wavelength switching unit 19 into the comparison unit 17 in the wavelength control unit 16 (S205).

The comparison unit 17 compares a wavelength of a light from the wavelength generation unit 15 and a wavelength of a wavelength-multiplexed optical signal from the multiplexing unit 13, and as a result of the comparison, detects a difference between wavelengths corresponding to a difference ("Δf") of both of the frequencies (S206).

The wavelength control unit 16 controls a wavelength of an optical signal output from the light output unit 10-2 in such a way that a difference (shift) between wavelengths detected by the comparison unit 17 is compensated (S207).

As mentioned above, the wavelength control unit 16 of the optical communication device 1 of the second exemplary embodiment of the present invention directly compares a wavelength of a light from the wavelength generation unit 15 and a wavelength of a wavelength-multiplexed optical signal from the multiplexing unit 13, and controls a wavelength of an optical signal output from the light output unit 10 corresponding to the compared wavelength. Accordingly, the optical communication device 1 in the first exemplary embodiment of the present invention can output a wavelength-multiplexed optical signal whose wavelength interval has higher accuracy.

Third Exemplary Embodiment

A third exemplary embodiment of the present invention will be described with reference to the Drawings.

In a third exemplary embodiment of the present invention, the optical communication device 1 comprises a coherent detection unit. By using interference characteristics between a wavelength-multiplexed signal and a reference light, a frequency of an optical signal output from an LD 101 in the light output unit 10 is controlled.

Figure 8:
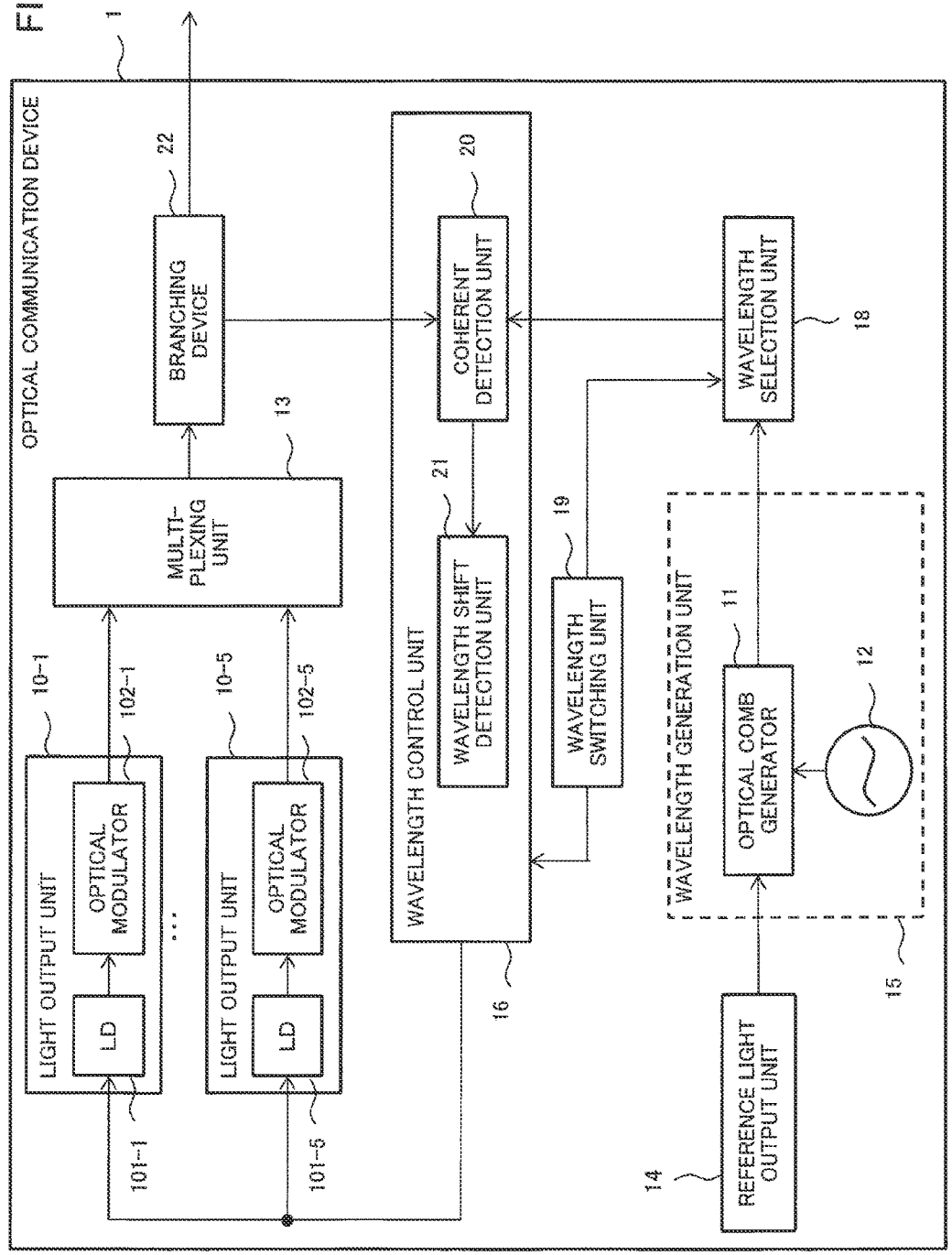
FIG. 8 is a diagram illustrating a configuration example of the optical communication device 1 in a third exemplary embodiment of the present invention.

FIG. 8 is a diagram illustrating a configuration example of the optical communication device 1 in the third exemplary embodiment of the present invention. As illustrated in FIG. 8, the optical communication device 1 in the third exemplary embodiment of the present invention comprises a coherent detection unit 20 and a wavelength shift detection unit 21 in place of the comparison unit 17. The optical communication device 1 comprises a branching device 22. The optical communication device 1 comprises LDs (Laser Diodes) 101-1 to 101-5 (unless there is a particular need for distinction, referred to as "LD 101") and optical modulators 102-1 to 102-5 (unless there is a particular need for distinction, referred to as "optical modulator 102").

The LD 101 outputs an optical signal having a predetermined frequency. A wavelength of an optical signal output from each of the plurality of LDs 101 is set to have a predetermined interval. Here, the wavelength of an optical signal output from the LD 101 may have a predetermined shift with respect to the set wavelength due to device-specific optical frequency setting accuracy of the LD 101.

The optical modulator 102 performs data modulation on an optical signal output from the LD 101, and outputs the signal to the multiplexing unit 13.

The multiplexing unit 13 outputs a wavelength-multiplexed signal obtained by multiplexing a plurality of optical signals output from a plurality of light output units 10 to the branch unit 22.

The branching device 22 branches a wavelength-multiplexed signal output from the multiplexing unit 13, and outputs one branched signal to a transmission path, and the other to the coherent detection unit 20.

The wavelength selection unit 18 inputs, among a plurality of lights (sideband light) included in an optical comb generated by the optical comb generator 11, a light whose wavelength has been specified by the wavelength switching unit 19 into the coherent detection unit 20.

The coherent detection unit 20 coherently detects a wavelength-multiplexed signal input from the branching device 22 and a light having a predetermined wavelength input from the wavelength selection unit 18. The coherent detection unit 20 outputs an interference signal between a wavelength-multiplexed signal input from the branching device 22 and the light input from the wavelength selection unit 18 to the wavelength shift detection unit 21.

The coherent detection unit 20 comprises a 90-degree hybrid mixer (not illustrated) which is called a coherent mixer in which a wavelength-multiplexed signal input from the branching device 22 interferes with a light input from the wavelength selection unit 18. The coherent mixer outputs a signal (an interference signal) obtained when a wavelength-multiplexed signal input from the branching device 22 interferes with a light input from the wavelength selection unit 18.

The wavelength shift detection unit 21 detects, based on an input interference signal, a difference (shift) of wavelengths between at least one optical signal included in a wavelength-multiplexed signal input from the wavelength selection unit 18 among wavelength-multiplexed signals and a light input from the wavelength selection unit 18.

Here, for the wavelength shift detection unit 21, a frequency offset estimator in a frequency offset compensation device described in Japanese Patent No. 5146285 can be used. A frequency offset is a difference of frequencies between an input light and a local light. A baseband electric signal from a front-end circuit is input to the frequency offset estimator, then the frequency offset estimator estimates a frequency offset included in the baseband electric signal, and outputs the estimated frequency offset to a device in a latter step as an electric signal. In the third exemplary embodiment of the present invention, the wavelength shift detection unit 21 outputs a difference (shift) of wavelengths corresponding to the estimated frequency offset as an electric signal.

The wavelength control unit 16 adjusts a wavelength of an optical signal output from the light output unit 10 specified by the wavelength switching unit 19 among a plurality of light output units 10 in such a way that a difference (shift) of wavelengths detected by the wavelength shift detection unit 21 is compensated. Similarly to the second exemplary embodiment, for the plurality of light output units 10, a wavelength variable laser device described in Japanese Patent No. 3197869 can be used.

Figure 9:
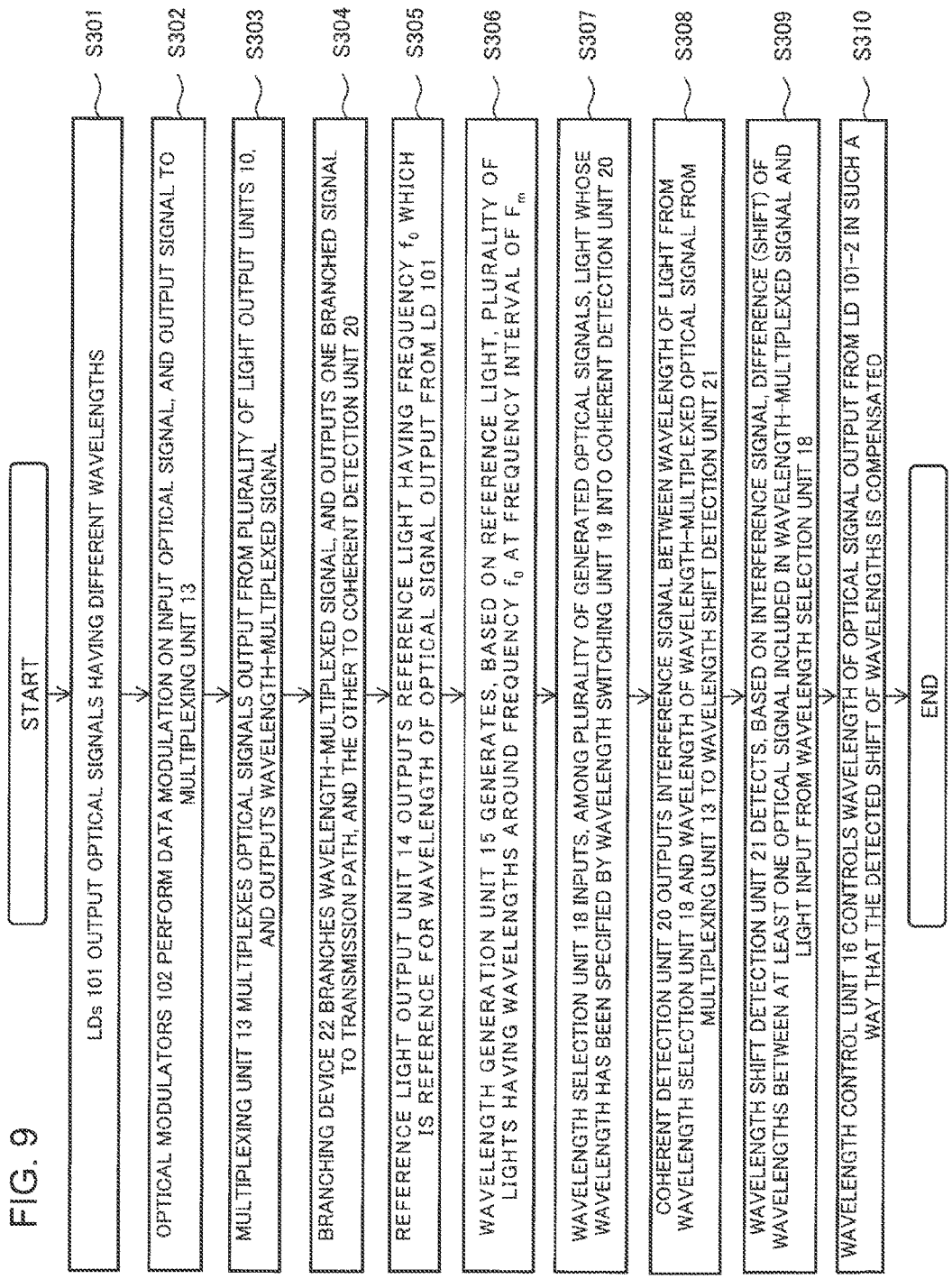
FIG. 9 is a flow chart illustrating an operational example of the optical communication device 1 in the third exemplary embodiment of the present invention.

FIG. 9 is flow chart illustrating an operational example of the optical communication device 1 in the third exemplary embodiment of the present invention. FIG. 9 is an example in which a wavelength of an optical signal output from the light output unit 10-2 shifts by a wavelength corresponding to a frequency "+Δf", and the wavelength of an optical signal output from the light output unit 10-2 is compensated.

The LDs 101 in the plurality of light output units 10 output optical signals having different wavelengths (S301).

Each of the optical modulator 102 performs data modulation on an optical signal output from the LD 101, and outputs the signal to the multiplexing unit 13 (S302).

The multiplexing unit 13 multiplexes optical signals output from the plurality of light output units 10, and outputs a wavelength-multiplexed signal (S303).

The branching device 22 branches a wavelength-multiplexed signal output from the multiplexing unit 13, and outputs one branched signal to a transmission path, and the other to the coherent detection unit 20 (S304).

The reference light output unit 14 outputs a reference light having a frequency $f_0$ which is a reference for a wavelength of an optical signal output from each light output unit 10 (S305).

The wavelength generation unit 15 generates, based on a reference light having a wavelength corresponding to a frequency $f_0$ output from the reference light output unit 14, a plurality of lights having wavelengths around the frequency $f_0$ at a frequency interval of $F_m$ (S306).

The wavelength selection unit 18 inputs, among the plurality of generated optical signals, a light whose wavelength has been specified by the wavelength switching unit 19 into the coherent detection unit 20 (S307).

The coherent detection unit 20 outputs a signal (an interference signal) obtained when a wavelength of a light from the wavelength selection unit 18 interferes with a wavelength of a wavelength-multiplexed optical signal from the multiplexing unit 13 to the wavelength shift detection unit 21 (S308).

The wavelength shift detection unit 21 detects, based on the interference signal, a difference (shift) of wavelengths between at least one optical signal included in a wavelength-multiplexed signal and a light input from the wavelength selection unit 18 (S309).

The wavelength control unit 16 controls a wavelength of an optical signal output from an LD 101-2 in the light output unit 10-2 in such a way that the difference (shift) of wavelengths detected by the wavelength shift detection unit 21 is compensated (S310).

As mentioned above, the optical communication device 1 of the third exemplary embodiment of the present invention comprises the coherent detection unit 20, and controls the LD 102 in the light output unit 10 using interference characteristics by making a wavelength-multiplexed signal directly interfere with a reference light. Accordingly, the optical communication device 1 in the third exemplary embodiment of the present invention can output a wavelength-multiplexed optical signal whose wavelength interval has higher accuracy.

Fourth Exemplary Embodiment

A fourth exemplary embodiment of the present invention will be described with reference to the Drawings.

A fourth exemplary embodiment of the present invention comprises a control device which instructs timing for controlling wavelength to the optical communication device 1.

Figure 10:
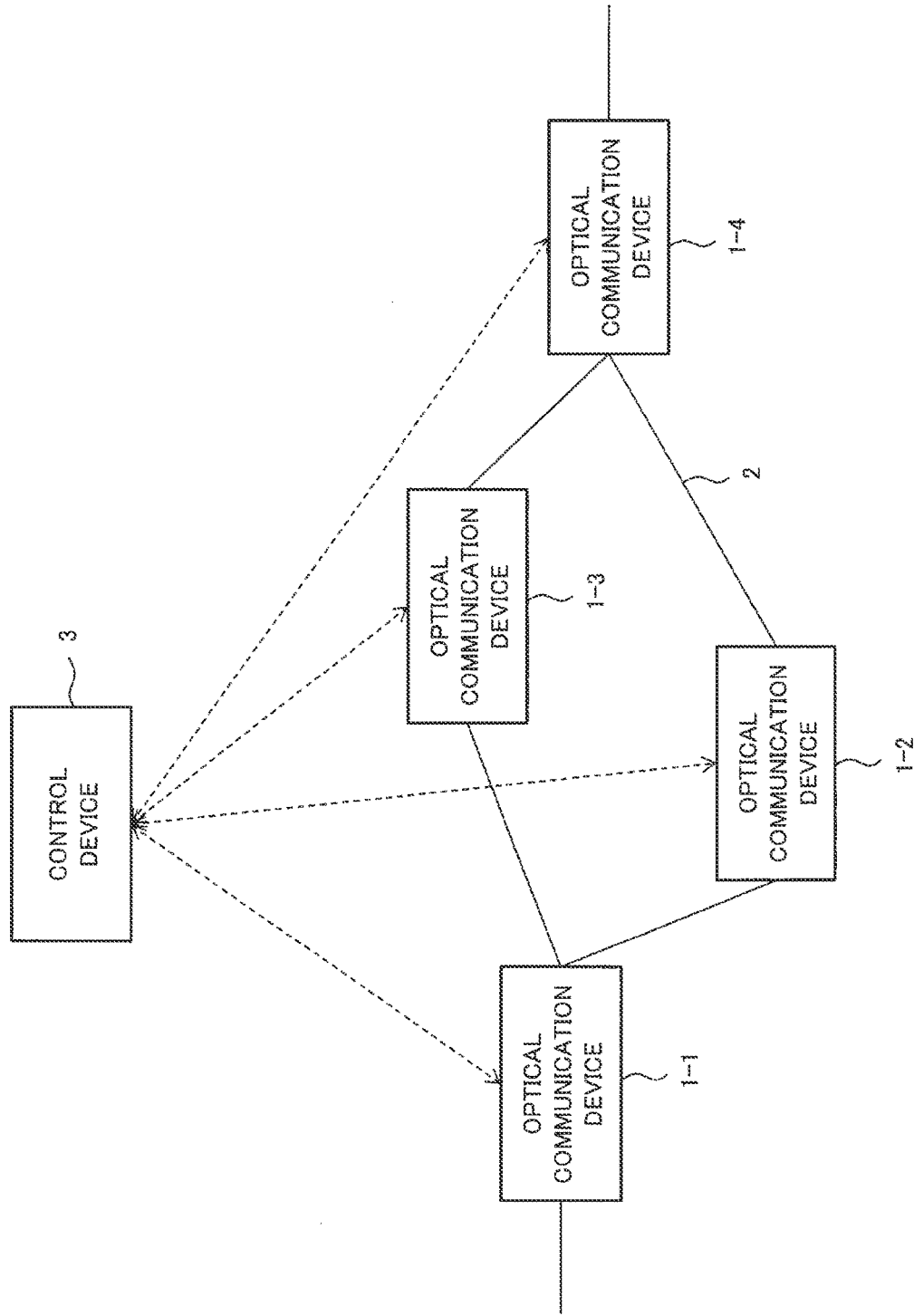
FIG. 10 is a diagram illustrating a configuration example of a communication system in a fourth exemplary embodiment of the present invention.

FIG. 10 is a diagram illustrating a configuration example of a communication system in a fourth exemplary embodiment of the present invention. As illustrated in FIG. 10, the communication system in the fourth exemplary embodiment of the present invention comprises optical communication devices 1-1 to 1-4 (unless there is a particular need for distinction, referred to as "optical communication device 1"), a transmission path 2, and a control device 3. In an example of FIG. 10, there are four optical communication devices 1, the number of the optical communication devices 1 is not limited to four, and any number of the optical communication devices 1 may be used.

The transmission path 2 is constituted of optical fibers, and may be configured, for example, by bundling a plurality of optical fibers.

The control device 3 instructs the optical communication device 1 to control a wavelength of an optical signal output from at least one of a plurality of light output units 10 at a predetermined timing. The timing for controlling wavelength is, for example, a cycle which is determined in advance based on a change of the LD 101 with time.

The control device 3 may specify the light output unit 10 which controls a wavelength. In this case, the control device 3 specifies the light output unit 10 which controls a wavelength to the wavelength switching unit 19. The optical communication device 1 then controls a wavelength of an optical signal output from the light output unit 10 specified by the control device 3.

A wavelength may be controlled when assignment of a wavelength to the light output unit 10 is changed (assignment of a channel is changed) in the optical communication device 1. Different wavelengths are assigned to a plurality of light output units 10, and data modulation is performed on an optical signal having the assigned wavelength, and an optical signal having the wavelength is output. For example, the optical communication device 1 changes assignment of a wavelength to the light output unit 10 when a channel interval is changed (for example, when a channel interval is changed from 50 GHz to 40 GHz). When assignment of a wavelength to the light output unit 10 is changed, a wavelength of an optical signal generated by the LD 101 (for example, a wavelength variable laser) in the light output unit 10 is changed, and therefore, the changed wavelength of an optical signal output from the LD 101 may shift from a desired wavelength. Accordingly, the control device 3 allows the optical communication device 1 to control a wavelength to cancel the wavelength shift.

The timing for controlling wavelength is not limited to the above-described example. For example, a wavelength may be controlled when a new light output unit 10 is added to the optical communication device 1.

Figure 11:
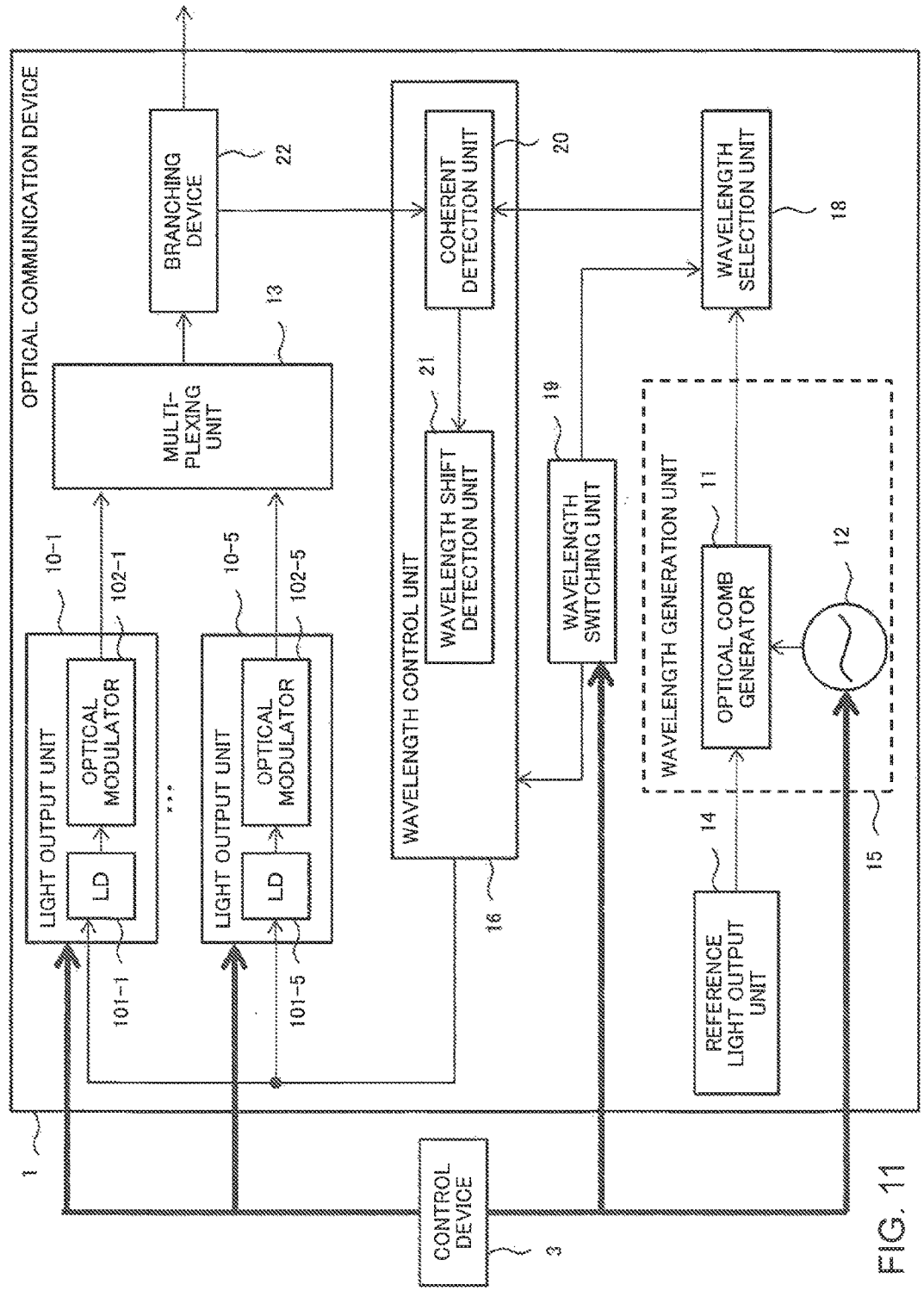
FIG. 11 is a diagram illustrating a configuration example of the optical communication device 1 in the fourth exemplary embodiment of the present invention.

FIG. 11 is a diagram illustrating a configuration example of the optical communication device 1 in the fourth exemplary embodiment of the present invention. FIG. 11 is an example in which the light output unit 10 controls a wavelength to be output when a channel interval is changed (for example, changed from 50 GHz to 40 GHz).

As illustrated in FIG. 11, when a channel interval is changed, the light output units 10 of the optical communication device 1 are notified of a newly assigned wavelength from the control device 3. Each of the light output units 10 changes a wavelength of an optical signal to be output based on the notification from the control device 3.

The microwave oscillator 12 of the optical communication device 1 is requested by the control device 3 to change a frequency $F_m$ of a clock signal to be output. The microwave oscillator 12 changes the frequency $F_m$ of a clock signal (for example, from 50 GHz to 40 GHz) when requested by the control device 3. Since the optical comb generator 11 is driven by a clock signal input from the microwave oscillator 12, a frequency interval $F_m$ of a frequency of an optical comb output from the optical comb generator 11 changes (for example, a frequency interval changes from 50 GHz to 40 GHz).

The wavelength switching unit 19 of the optical communication device 1 is notified by the control device 3 of a wavelength (the wavelength of an optical signal output from each of the plurality of light output units 10) which is set to each of the plurality of light output units 10. The wavelength switching unit 19 specifies a wavelength of a light selected by the wavelength selection unit 18 based on a wavelength notified by the control device 3. The wavelength selection unit 18 selects a light having the wavelength specified by the wavelength switching unit 19 among a plurality of lights generated by the wavelength generation unit 15, and inputs the light into the coherent detection unit 20. The wavelength switching unit 19 specifies a light output unit 10 which outputs an optical signal corresponding to the specified wavelength based on the notification from the control device 3, and notifies the specified light output unit 10 to the wavelength control unit 16. The wavelength control unit 16 controls the specified wavelength of an optical signal output from the light output unit 10 based on the notification from the wavelength switching unit 19.

Figure 12:
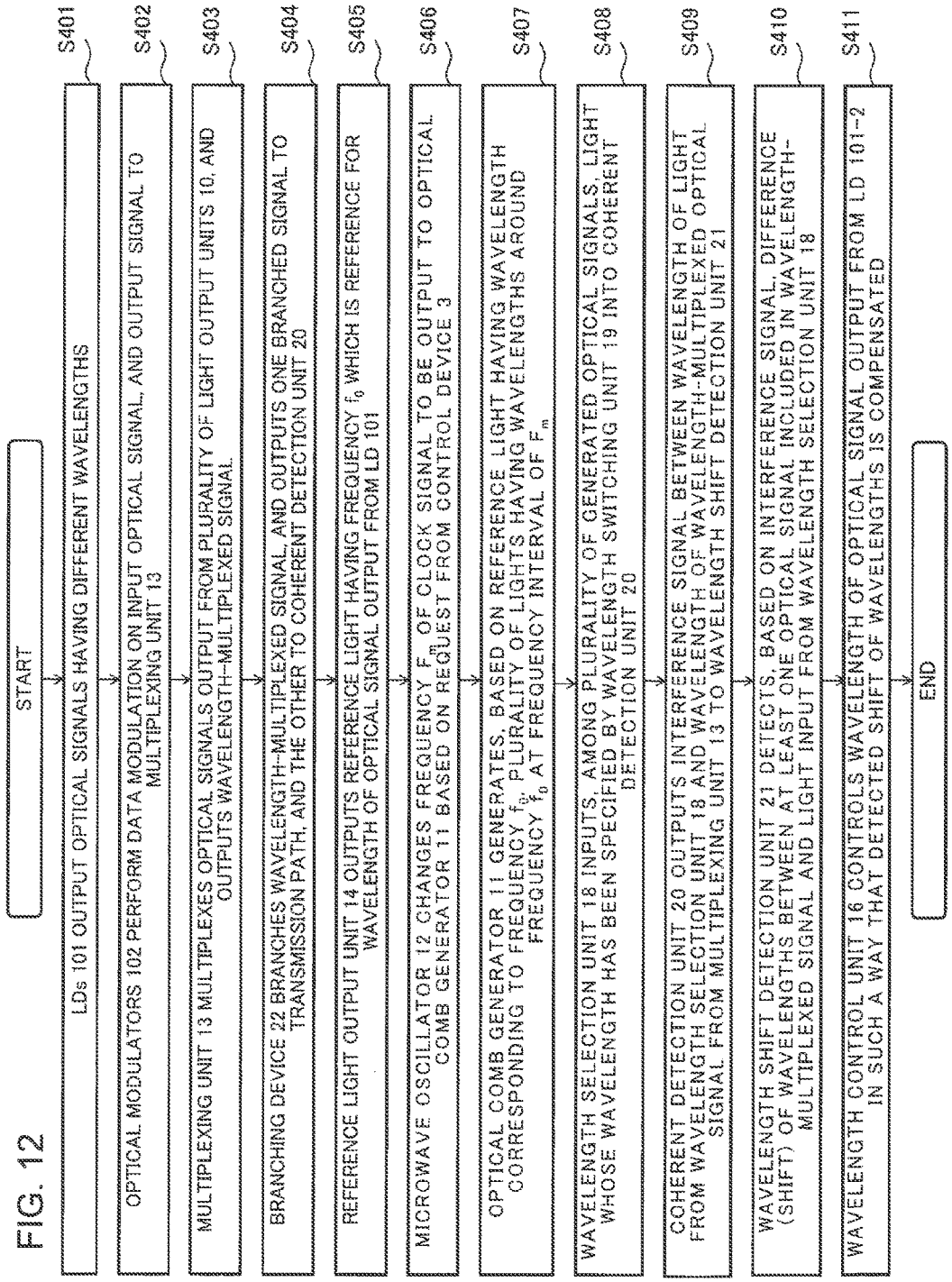
FIG. 12 is a flow chart illustrating an operational example of the optical communication device 1 in the fourth exemplary embodiment of the present invention.

FIG. 12 is a flow chart illustrating an operational example of the optical communication device 1 in the fourth exemplary embodiment of the present invention. FIG. 12 is an example in which the light output unit 10 controls a wavelength output from the light output unit 10 when a channel interval is changed (for example, from 50 GHz to 40 GHz).

Each LD 101 in the plurality of light output units 10 changes a wavelength of an optical signal to be output based on the change of assignment of a wavelength notified by the control device 3 (S401).

Each of the optical modulator 102 performs data modulation on an optical signal output from the LD 101, and outputs the signal to the multiplexing unit 13 (S402).

The multiplexing unit 13 multiplexes optical signals output from the plurality of light output units 10, and outputs a wavelength-multiplexed signal (S403).

The branching device 22 branches a wavelength-multiplexed signal output from the multiplexing unit 13, and outputs one branched signal to a transmission path, and the other to the coherent detection unit 20 (S404).

The reference light output unit 14 outputs a reference light having a frequency $f_0$ which is a reference for a wavelength of an optical signal output from each light output unit 10 (S405).

The microwave oscillator 12 changes a frequency $F_m$ of a clock signal to be output to the optical comb generator 11 based on a request from the control device 3 (S406).

The optical comb generator 11 generates, based on a reference light having a wavelength corresponding to a frequency $f_0$ output from the reference light output unit 14, a plurality of lights having wavelengths around the frequency $f_0$ at a frequency interval of $F_m$ (S407).

The wavelength selection unit 18 inputs, among the plurality of optical signals generated by the optical comb generator 11, a light whose wavelength has been specified by the wavelength switching unit 19 into the coherent detection unit 20 (S408).

The coherent detection unit 20 outputs a signal (an interference signal) obtained when a wavelength of a light from the wavelength selection unit 18 interferes with a wavelength of a wavelength-multiplexed optical signal from the multiplexing unit 13 to the wavelength shift detection unit 21 (S409).

The wavelength shift detection unit 21 detects, based on the interference signal, a difference (shift) of wavelengths between at least one optical signal included in a wavelength-multiplexed signal and a light input from the wavelength selection unit 18 (S410).

The wavelength control unit 16 controls a wavelength of an optical signal output from an LD 101-2 in the light output unit 10-2 in such a way that the difference (shift) of wavelengths detected by the wavelength shift detection unit 21 (S411).

As mentioned above, the fourth exemplary embodiment of the present invention comprises the control device 3 which instructs timing for controlling wavelength to the optical communication device 1, and the optical communication device 1 controls a wavelength of an optical signal output from the light output unit 10 based on the instruction from the control device 3. Accordingly, the optical communication device 1 can control a wavelength by a timing instructed by the control device 3, which makes it possible to flexibly control timing for controlling wavelength.

Fifth Exemplary Embodiment

A fifth exemplary embodiment of the present invention will be described. In the fifth exemplary embodiment, a computer, a CPU (Central Processing Unit), an MPU (Micro-Processing Unit) and the like of the optical communication device 1 executes a software (a program) which realizes a function described in each of the above-described exemplary embodiments.

In the fifth exemplary embodiment of the present invention, the optical communication device 1 acquires a software (a program) which realizes a function of the above-described exemplary embodiments via a variety of storage media or a network, which is non-transitory one, such as a CD-R (Compact Disc Recordable). A program which the optical communication device 1 acquires or a storage medium on which the program is stored constitutes the present invention. The software (program) may be stored in a predetermined storage unit, which is non-transitory one, included in the optical communication device 1.

A computer, a CPU, an MPU, or the like of the optical communication device 1 reads a program code from the acquired software (program) and execute the program code. In other words, the optical communication device 1 executes a processing identical to the processing of the optical communication device 1 in each of the above-described exemplary embodiments.

The fifth exemplary embodiment of the present invention can be applied to a use such as a program realized by a computer, a CPU, or an MPU of the optical communication device 1.

A part or the whole of the above-described exemplary embodiment can be described as in the following Supplementary notes, but is not limited thereto.

[Supplementary Note 1]

An optical communication device comprising:
a plurality of light output units for outputting optical signals having different wavelengths,
a multiplexing unit for outputting a wavelength-multiplexed signal obtained by multiplexing a plurality of optical signals output from the plurality of light output units,
a reference light output unit for outputting a reference light which is a reference,
a wavelength generation unit for outputting, based on the reference light, a plurality of lights having a wavelength interval depending on a predetermined frequency, and
a wavelength control unit for controlling, depending on an interference component between the wavelength-multiplexed signal and a light having at least one wavelength among the plurality of lights, a wavelength of an optical signal output from the light output unit.

[Supplementary Note 2]

The optical communication device according to Supplementary note 1, wherein the wavelength control unit comprises a comparison unit for comparing the wavelength-multiplexed signal and a light having at least one wavelength among the plurality of lights.

[Supplementary Note 3]

The optical communication device according to Supplementary note 1 or 2, wherein
the wavelength control unit comprises:
a coherent detection unit for coherently detecting the wavelength-multiplexed signal and a light having at least one wavelength among the plurality of lights; and
a wavelength shift detection unit for detecting, based on an interference signal input from a coherent detection unit, a difference between a wavelength of at least one optical signal among the optical signals included in the wavelength-multiplexed signal and a wavelength of at least one light among the plurality of lights.

[Supplementary Note 4]

The optical communication device according to any one of Supplementary notes 1 to 3, comprising a wavelength selection unit for selecting a light having at least one wavelength among a plurality of lights generated by the wavelength generate unit.

[Supplementary Note 5]

The optical communication device according to Supplementary note 4, comprising a wavelength switching unit for instructing the at least one wavelength to be selected to the wavelength selection unit.

[Supplementary Note 6]

The optical communication device according to any one of Supplementary notes 1 to 5, wherein
the wavelength generate unit comprises:
a microwave oscillator which outputs a clock signal having a predetermined frequency; and
an optical comb generator which outputs, based on the reference light, a plurality of lights having a wavelength interval depending on the predetermined frequency.

[Supplementary Note 7]

The optical communication device according to Supplementary note 6, wherein
the wavelength switching unit notifies, based on at least one wavelength which has been instructed to the wavelength selection unit, a light output unit for controlling a wavelength of an optical signal to be output among the plurality of light output units to the wavelength control unit, and
the wavelength control unit controls a wavelength of an optical signal output from the light output unit notified by the wavelength switching unit.

[Supplementary Note 8]

The optical communication device according to Supplementary note 6 or 7, wherein
the wavelength switching unit changes at least one wavelength which is instructed to the wavelength selection unit and a light output unit which is notified to the wavelength control unit in turn, and
the wavelength control unit controls a wavelength of an optical signal output from the light output unit notified by the wavelength switching unit in turn.

[Supplementary Note 9]

An optical communication system comprising:
an optical communication device comprising:
a plurality of light output units for outputting optical signals having different wavelengths;
a multiplexing unit for outputting a wavelength-multiplexed signal obtained by multiplexing a plurality of optical signals output from the plurality of light output units;
a reference light output unit for outputting a reference light which is a reference;
a wavelength generation unit for outputting, based on the reference light, a plurality of lights having a wavelength interval depending on a predetermined frequency; and
a wavelength control unit for controlling, depending on an interference component between the wavelength-multiplexed signal and a light having at least one wavelength among the plurality of lights, a wavelength of an optical signal output from the light output unit; and
a control device which instructs the optical communication device to control a wavelength of an optical signal output from at least one of the plurality of light output units at a predetermined timing.

[Supplementary Note 10]

The optical communication system according to Supplementary note 9, wherein the control device specifies a light output unit for controlling a wavelength of the optical signal, and notifies the specified light output unit to the optical communication device.

[Supplementary Note 11]

The optical communication system according to Supplementary note 9 or 10, wherein the predetermined timing is when the control device changes assignment of a wavelength of an optical signal output from the plurality of light output units.

[Supplementary Note 12]

The optical communication system according to Supplementary notes 9 to 11, wherein the predetermined timing is when the control device changes a wavelength interval of an optical signal output from the plurality of light output units.

[Supplementary Note 13]

The optical communication system according to Supplementary note 12, wherein the control device instructs the optical communication device to change a wavelength interval of a plurality of lights generated by the wavelength generation unit when the wavelength interval is changed.

[Supplementary Note 14]

An optical communication method comprising:
outputting an optical signal having a different wavelength;
outputting the wavelength-multiplexed signal obtained by multiplexing a plurality of optical signals;
outputting a reference light which is a reference;
outputting, based on the reference light, a plurality of lights having a wavelength interval depending on a predetermined frequency; and
controlling, depending on an interference component between the wavelength-multiplexed signal and a light having at least one wavelength among the plurality of lights, a wavelength of the output optical signal.

[Supplementary Note 15]

The optical communication method according to Supplementary note 14, wherein the wavelength-multiplexed signal and a light having at least one wavelength among the plurality of lights are compared.

[Supplementary Note 16]

The optical communication method according to Supplementary note 14 or 15, wherein
the wavelength-multiplexed signal and a light having at least one wavelength among the plurality of lights are coherently detected, and
a difference between a wavelength of at least one optical signal among the optical signals included in the wavelength-multiplexed signal and a wavelength of at least one light among the plurality of lights is detected based on the coherently detected interference signal.

[Supplementary Note 17]

The optical communication method according to any one of Supplementary notes 14 to 16, wherein at least one of light having a wavelength among the generated plurality of lights is selected.

[Supplementary Note 18]

The optical communication method according to Supplementary notes 17, wherein the at least one wavelength to be the selected is instructed.

[Supplementary Note 19]

The optical communication method according to any one of Supplementary notes 14 to 18, wherein
a clock signal having a predetermined frequency is output, and
a plurality of lights having a wavelength interval depending on the predetermined frequency is output based on the reference light.

[Supplementary Note 20]

A program for allowing a computer to execute:
a processing of outputting optical signals having different wavelengths;
a processing of outputting a wavelength-multiplexed signal obtained by multiplexing a plurality of optical signals output from the plurality of light output units;
a processing of outputting a reference light which is a reference;
a processing of outputting, based on the reference light, a plurality of lights having a wavelength interval depending on a predetermined frequency, and
a processing of controlling, depending on an interference component between the wavelength-multiplexed signal and a light having at least one wavelength among the plurality of lights, a wavelength of the output optical signal.

[Supplementary Note 21]

The program according to Supplementary note 20, comprising a processing of comparing the wavelength-multiplexed signal and a light having at least one wavelength among the plurality of lights.

[Supplementary Note 22]

The program according to Supplementary note 20 or 21, comprising:
a processing of coherently detecting the wavelength-multiplexed signal and a light having at least one wavelength among the plurality of lights; and
a processing of detecting a difference between a wavelength of at least one optical signal among the optical signals included in the wavelength-multiplexed signal and a wavelength of at least one light among the plurality of lights, based on the coherently detected interference signal.

[Supplementary Note 23]

The program according to any one of Supplementary notes 20 to 22, comprising a processing of selecting a light having at least one wavelength among the generated plurality of lights.

[Supplementary Note 24]

The program according to Supplementary note 23, comprising a processing of instructing the at least one wavelength to be selected.

[Supplementary Note 25]

The program according to any one of Supplementary notes 20 to 24, comprising:
a processing of outputting a clock signal having a predetermined frequency; and
a processing of outputting, based on the reference light, a plurality of lights having a wavelength interval depending on the predetermined frequency.

The present invention has been described with reference to the exemplary embodiments. However, applicable aspects of the present invention are not limited to the above-described exemplary embodiments. The configuration or a detailed description of the present invention may be modified in various ways which can be understood by those skilled in the art within a scope of the present invention.

This application claims the priority based on Japanese Patent Application No. 2014-065011 filed on Mar. 27, 2014, the entire disclosure of which is incorporated herein by reference.

REFERENCE SIGNS LIST 1, 1-1, 1-2, 1-3, 1-4 Optical communication device
2 Transmission path
3 Control device
10, 10-1, 10-2, 10-3, 10-4, 10-5 Light output unit
11 Optical comb generator
12 Microwave oscillator
13 Multiplexing unit
14 Reference light output unit
15 Wavelength generation unit
16 Wavelength control unit
17 Comparison unit
18 Wavelength selection unit
19 Wavelength switching unit
20 Coherent detection unit
21 Wavelength shift detection unit
22 Branching device
101 LD
102 Optical modulator

The invention claimed is:

1. An optical communication device comprising:
a plurality of light sources configured to output a plurality of optical signals having different wavelengths,
a multiplexor configured to multiplex the plurality of optical signals and output the multiplexed signal as a wavelength-multiplexed signal;
a reference light source configured to output a reference light, the reference light source differing from the plurality of light sources,
a wavelength generator configured to selectively output one of a plurality of lights having a predetermined wavelength by using the reference light, and
a wavelength controller configured to compensate a gap between a wavelength of an optical signal output from the plurality of light sources and a wavelength of light output from the wavelength generator, by using the wavelength-multiplexed signal and light output from the wavelength generator.

2. The optical communication device according to claim 1, wherein the wavelength controller includes a comparator configured to compare the wavelength-multiplexed signal and a light having at least one wavelength among the optical signals.

3. The optical communication device according to claim 1, wherein
the wavelength controller includes:
a coherent detector configured to coherently detect the wavelength-multiplexed signal and a light output from the wavelength generator; and
a wavelength shift detector configured to detect, based on an interference signal input from the coherent detector, a difference between a wavelength of at least one optical signal among the optical signals included in the wavelength-multiplexed signal and a wavelength of a light output from the wavelength generator.

4. The optical communication device according to claim 1, comprising wavelength selector configured to select a light having at least one wavelength among a plurality of lights generated by the wavelength generator.

5. The optical communication device according to claim 4, comprising wavelength switcher configured to instruct that the at least one wavelength be selected by the wavelength selector.

6. The optical communication device according to claim 5, wherein
the wavelength switcher is configured to notify, based on at least one wavelength that has been instructed by the wavelength selector, the wavelength controller, and
the wavelength controller is configured to control a wavelength of an optical signal output from the wavelength generator notified by the wavelength switcher.

7. The optical communication device according to claim 5, wherein
the wavelength switcher is configured to change at least one wavelength that is instructed by the wavelength selector and the wavelength controller is notified, and
the wavelength controller is configured to control a wavelength of an optical signal output from the wavelength generator notified by the wavelength switcher.

8. The optical communication device according to claim 1, wherein
the wavelength generator comprises:
a microwave oscillator that outputs a clock signal having a predetermined frequency; and
an optical comb generator that outputs, based on the reference light, a plurality of lights having a wavelength interval depending on the predetermined frequency.

9. An optical communication system comprising:
an optical communication device including:
a plurality of light sources configured to output a plurality of optical signals having different wavelengths;
a multiplexor configured to multiplex the plurality of optical signals and output the multiplexed signal as a wavelength-multiplexed signal;
a reference light source configured to output a reference light, the reference light source differing from the plurality of light sources;
a wavelength generator configured to selectively output one of a plurality of lights having a predetermined wavelength by using the reference light; and
a wavelength controller configured to compensate a gap between a wavelength of an optical signal output from the plurality of light sources and a wavelength of light output from the wavelength generator, by using the wavelength-multiplexed signal and light output from the wavelength generator; and
a control device configured to instruct the optical communication device to control a wavelength of an optical signal output from at least one of the plurality of light sources at a predetermined timing.

10. The optical communication system according to claim 9, wherein the control device specifies the light source that controls a wavelength of the optical signal, and notifies the optical communication device of the specified light source.

11. The optical communication system according to claim 9, wherein the predetermined timing is when the control device changes assignment of a wavelength of an optical signal output from the plurality of light sources.

12. The optical communication system according to claim 9, wherein the predetermined timing is when the control device changes a wavelength interval of an optical signal output from the plurality of light sources.

13. The optical communication system according to claim 12, wherein the control device instructs the optical communication device to change a wavelength interval of a plurality of lights generated by the wavelength generator when the wavelength interval is changed.

14. An optical communication method comprising:
outputting a plurality of optical signals having different wavelengths;
outputting a wavelength-multiplexed signal obtained by multiplexing the plurality of optical signals;
outputting a reference light;
outputting, based on the reference light, one of a plurality of lights having a predetermined wavelength; and
compensating a gap between a wavelength of an optical signal of the plurality of optical signals and a wavelength of one of the plurality of lights having a predetermined wavelength.

15. A non-transitory program recording medium storing thereon a program for allowing a computer to execute processing to perform:
outputting a plurality of optical signals having different wavelengths;
outputting a wavelength-multiplexed signal obtained by multiplexing the plurality of optical signals;
outputting a reference light;
outputting, based on the reference light, one of a plurality of lights having a predetermined wavelength, and compensating a gap between a wavelength of an optical signal of the plurality of optical signals and a wavelength of one of the plurality of lights having a predetermined wavelength.

16. The optical communication device according to claim 2, wherein
the wavelength controller includes:
a coherent detector configured to coherently detect the wavelength-multiplexed signal and a light having at least one wavelength among the optical signals; and
a wavelength shift detector configured to detect, based on an interference signal input from the coherent detector, a difference between a wavelength of at least one optical signal among the optical signals included in the wavelength-multiplexed signal and a wavelength of at least one light among the plurality of optical signals.

17. The optical communication device according to claim 2, comprising wavelength selector configured to select a light having at least one wavelength among a plurality of lights generated by the wavelength generator.

18. The optical communication device according to claim 3, comprising wavelength selector configured to select a light having at least one wavelength among a plurality of lights generated by the wavelength generator.

19. The optical communication device according to claim 2, wherein
the wavelength generator includes:
a microwave oscillator that outputs a clock signal having a predetermined frequency; and
an optical comb generator that outputs, based on the reference light, a plurality of lights having a wavelength interval depending on the predetermined frequency.

20. An optical communication device comprising:
a processor configured to:
output a plurality of optical signals having different wavelengths,
output a wavelength-multiplexed signal obtained by multiplexing the plurality of optical signals,
output a reference light,
output, using the reference light, one of a plurality of lights having a predetermined wavelength, and
compensating a gap between a wavelength of an optical signal of the plurality of optical signals and the light having a predetermined wavelength, by using the wavelength-multiplexed signal and the light having a predetermined wavelength.

* * * * *